(12) United States Patent
Janssen et al.

(10) Patent No.: US 8,817,148 B2
(45) Date of Patent: Aug. 26, 2014

(54) METHOD FOR ACQUIRING DATA WITH AN IMAGE SENSOR

(71) Applicant: FEI Company, Hillsboro, OR (US)

(72) Inventors: Bart Jozef Janssen, Eindhoven (NL); Gerrit Cornelis van Hoften, Veldhoven (NL); Uwe Luecken, Eindhoven (NL)

(73) Assignee: FEI Company, Hillsboro, OR (US)

( * ) Notice: Subject to any disclaimer, the term of this patent is extended or adjusted under 35 U.S.C. 154(b) by 134 days.

(21) Appl. No.: 13/645,725

(22) Filed: Oct. 5, 2012

(65) Prior Publication Data

US 2013/0093931 A1  Apr. 18, 2013

Related U.S. Application Data

(60) Provisional application No. 61/544,141, filed on Oct. 6, 2011.

(30) Foreign Application Priority Data

Oct. 6, 2011 (EP) .................................... 11184107

(51) Int. Cl.
   *H04N 3/14* (2006.01)
   *H04N 5/335* (2011.01)

(52) U.S. Cl.
   USPC ........... 348/294; 348/298; 348/302; 348/308; 348/312

(58) Field of Classification Search
   USPC ......... 348/294–324; 250/208.1; 257/290–292
   See application file for complete search history.

(56) References Cited

U.S. PATENT DOCUMENTS

| 7,262,411 | B2 | 8/2007 | Nguyen-Huu et al. |
| 7,845,245 | B2 | 12/2010 | Hayles et al. |
| 7,851,769 | B2 | 12/2010 | Schmid et al. |
| 8,334,512 | B2 | 12/2012 | Luecken et al. |
| 8,338,782 | B2 | 12/2012 | Luecken et al. |

(Continued)

FOREIGN PATENT DOCUMENTS

| EP | 2312829 | 4/2011 |
| EP | 2381236 | 10/2011 |

OTHER PUBLICATIONS

"Centre for Instrumentation, 2001-2003", http://www.efi.circ.ac.uk/reports/CFIB-p05-03.pdf, Jun. 2003, 42 pgs.

(Continued)

*Primary Examiner* — Yogesh Aggarwal
(74) *Attorney, Agent, or Firm* — Scheinberg & Associates, PC; Michael O. Scheinberg

(57) ABSTRACT

To avoid reset noise in a CMOS chip for direct particle counting, it is known to use Correlative Double Sampling: for each signal value, the pixel is sampled twice: once directly after reset and once after an integration time. The signal is then determined by subtracting the reset value from the later acquired value, and the pixel is reset again. In some embodiments of the invention, the pixel is reset only after a large number of read-outs. Applicants realized that typically a large number of events, typically approximately 10, are needed to cause a full pixel. By either resetting after a large number of images, or when one pixel of the image shows a signal above a predetermined value (for example 0.8 × the full-well capacity), the image speed can be almost doubled compared to the prior art method, using a reset after acquiring a signal.

20 Claims, 2 Drawing Sheets

(56) References Cited

U.S. PATENT DOCUMENTS

Figure 1:
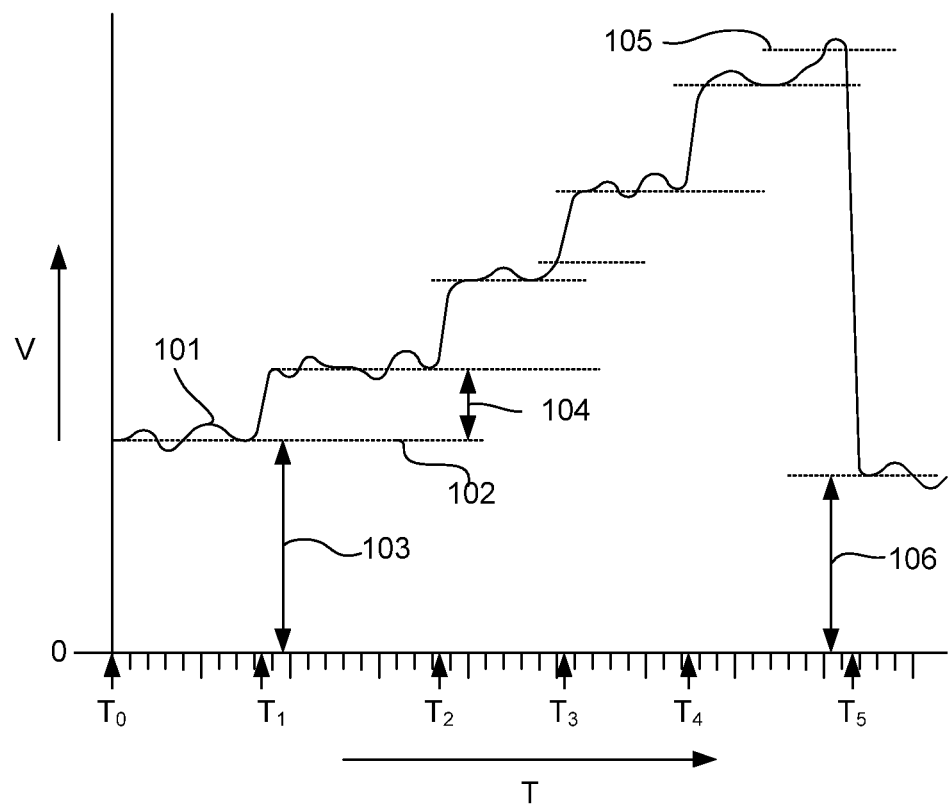

| | | | |
|---|---|---|---|
| 2008/0055440 A1 | 3/2008 | Pertsel et al. | |
| 2009/0219387 A1 | 9/2009 | Marman et al. | |
| 2011/0050969 A1* | 3/2011 | Nishihara | 348/296 |
| 2011/0266439 A1 | 11/2011 | Luecken et al. | |
| 2012/0032078 A1 | 2/2012 | Stekelenburg et al. | |
| 2012/0256085 A1 | 10/2012 | Otten et al. | |

OTHER PUBLICATIONS

Chen, W., et al., "High Resistivity Silicon Active Pixel Sensors for Recording Data from STEM," Nuclear Instruments and Methods in Physics Research Section A, Oct. 11, 2003, pp. 368-377, vol. 512, Issues 1-2.

Extended European Search Report for Appl. No. 12187329.3, Nov. 6, 2012, 7 pages.

\* cited by examiner

METHOD FOR ACQUIRING DATA WITH AN IMAGE SENSOR

This application claims priority from U.S. Provisional Patent Application 61/544,141, filed Oct. 6, 2011, which is hereby incorporated by reference.

The invention relates to a method for acquiring data with an image sensor, the sensor showing a multitude of pixels, the sensor using a reset to bring the pixels to a predetermined state, the method comprising the steps of resetting the voltage of a pixel, reading the voltage of the pixel a first time, resulting in a first read-out value for the pixel, reading the voltage of each pixel a second time, resulting in a second read-out value for the pixel, and determining the difference between the first and the second read-out value of the pixel.

Such a method is known as Correlative Double Sampling (CDS) and is described in, for example, U.S. Pat. No. 6,969,879B2. The method is used to reduce Fixed Pattern Noise (FPN) and Reset Noise (RN) in, for example, CMOS sensors In a CMOS sensor a large number of sensitive elements, further referred to as pixels, in the form of photo diodes are arranged in an array. Each of these pixels can be selectively connected to an Analogue-to-Digital Convertor (ADC), and the voltage over the pixel is digitized. The voltage over the pixels is a result of impinging radiation, such as light. It is noted that a CMOS detector is often equipped with a multitude of ADC's, each ADC assigned to a group of pixels.

The voltage over the pixel after a reset varies from reset to reset. By measuring the voltage over the pixel after a reset, and then reading it out after an integration time, the signal without reset noise can be determined by subtracting the two values from each other.

By determining the signal of all pixels a frame is read-out. The inverse of the time it takes to read-out all pixels (the whole frame) once is named the frame rate.

A disadvantage for said CDS method is that for each image all pixels of the sensor need to be read-out twice. This limits the maximum frame-rate with which the sensor can be read-out, and introducing CDS effectively halves the frame rate.

When using an image sensor for direct particle detection, such as direct electron detection, single particle detection is preferred. Also when using X-rays single event detection is preferred to determine the energy of the X-ray photon, and to distinguish between, for example, two low energy photons from one high energy photon. The occurrence of a single particle or X-ray photon impinging on the detector is then determined by the signal on one or a group of neighboring pixels. The read-out speed of the sensor must be sufficiently high to have a negligible chance that two particles or photons are detected by one pixel between read-outs. The reason is that the signal that is generated by an impinging particle can vary and therefore the difference between e.g. one and two, or three and four particles cannot be determined reliably. For a description of the variation of the signal resulting from one impinging electron, see for example "CMOS Pixel Sensor Response to Low Energy Electrons in Transmission Electron Microscopy", M. Battaglia et al., Nuclear Instruments and Methods in Physics Research Section A: Accelerators, Spectrometers, Detectors and Associated Equipment (2009), Vol. 605, Issue: 3, pages 350-35 (further referred to as Battaglia), specifically FIG. 1.

There is a need for sensors capable to read-out at a high frame rate with a performance of other criteria equal to that of the sensor using CDS.

It is an object of the invention to provide a method with which a standard image sensor can be operated without loss of performance at a higher frame rate than when using CDS.

To that end the method according to the invention is characterized by

A subsequent step of reading the voltage of the pixel a third time, resulting in a third read-out value, between the step of reading the voltage of the pixel a second time and the subsequent step of reading the voltage of the pixel a third time no reset occurs, and a step of determining a second signal by subtracting the second read-out value from the third read-out value.

The invention is based on the insight that the capacity of the well (the amount of charge or signal or voltage that can be stored in a pixel) before it overflows, the so-called full-well capacity, is many times larger than the charge resulting from one impinging particle. Typically the full-well capacity corresponds with at least 10 incident particles. By first resetting the pixel, and then reading out the pixel N=1 ... $N_{max}$ times, and determining the signal per read-out cycles by pair wise subtracting the N−1 value from the $N^{th}$ value, less resets need to be generated.

When reading-out M images, the prior art CDS method uses 2×M read-out cycles, while when using the method according to the invention only M+1 read-out cycles are needed. The result is thus a much improved read-out speed.

The invention is particularly valuable as the method can be performed on a standard, unmodified sensor.

In a preferred embodiment the invention is used to detect particles, such a neutrons, positrons, electrons, and/or X-rays.

Such particles are typically detected with a flux that is low compared to the flux of photons when detecting light. The chance that a multitude of events occurs at one pixel is often negligible. Also earlier mentioned particle counting is often preferred. The method according to the invention, offering a higher frame-rate than the prior art method, is then better suited than the prior art method.

It is noted that the method can also be used when detecting light, but it is unlikely that a fast read-out is required while no overflow of a well occur, or that photon counting is used. However, should this be preferred, for example for photon counting, the method according to the invention can be advantageous.

When detecting such particles the difference between two subsequently acquired data can be compared to the minimum that an impinging particle would cause. The signal can then be expressed as the number of impinging particles per pixel. As known to the person skilled in the art particle counting results in a better signal-to-noise ratio than analogue processing.

In a preferred embodiment the detection of a particle is deduced from the (change of) signal of a group of adjacent pixels.

As known to the skilled person one particle, such as an electron, often causes a signal in several adjacent pixels, see for example Battaglia. In such a case the occurrence of an event and the position of the event may be derived from the signal of several adjacent pixels, for example a group of 4×4 pixels.

In one embodiment the CMOS sensor is reset, either after a predetermined number of read-outs (images) since the last reset, or after detecting that at least one pixel in the series of read-out forming the last frame has a charge above a predetermined value (typically close to the full-well value, for example 0.8 times the full-well value).

In another embodiment the pixels are reset one at a time, when it is determined that they approach the full-well value. This, however, will probably involve a redesign of the sensor with respect to prior art sensors.

The method can also be used when reading out CCD's. As known to the skilled person, in a CCD sensor a series of pixels is connected together in such a way, that—triggered by clock signals—the charge of the pixels can shift from one pixel to another. As a result the charge of a series of pixels (either a row or a column) can be shifted serially to the last pixel of the row, the output node. This output node is connected to a charge amplifier. The output node is first reset, and then the charge from one of the row of pixels is shifted in the node, after which the charge amplifier outputs an output signal that is proportional to the charge of the output node. Using CDS for a CCD means that after a reset the remaining charge is determined, and after the shifting the signal is determined by subtracting the voltage measured during reset from the voltage measured when the output node contains the charge of the pixel. The subtraction can be done by a subtraction of the analogue values (for example by storing the charge on a capacitor) or by subtracting values after digitization. By eliminating the reset, gain in time can be achieved.

In an aspect of the invention a camera for detecting radiation, the camera comprising an image sensor and a controller for controlling reading-out and reset of the sensor, is characterized in that the controller is programmed for performing the method according to the invention.

The working of the sensor, including reset and read-out cycles, are typically controlled by a controller, either on chip (sharing the silicon of the sensor) or (at least partly) off-chip. How the controller executes the cycles can then be based on the contents of a programmable memory, such as a EEPROM. In that case an existing sensor can be upgraded to perform the method according to the invention.

Figure 2:
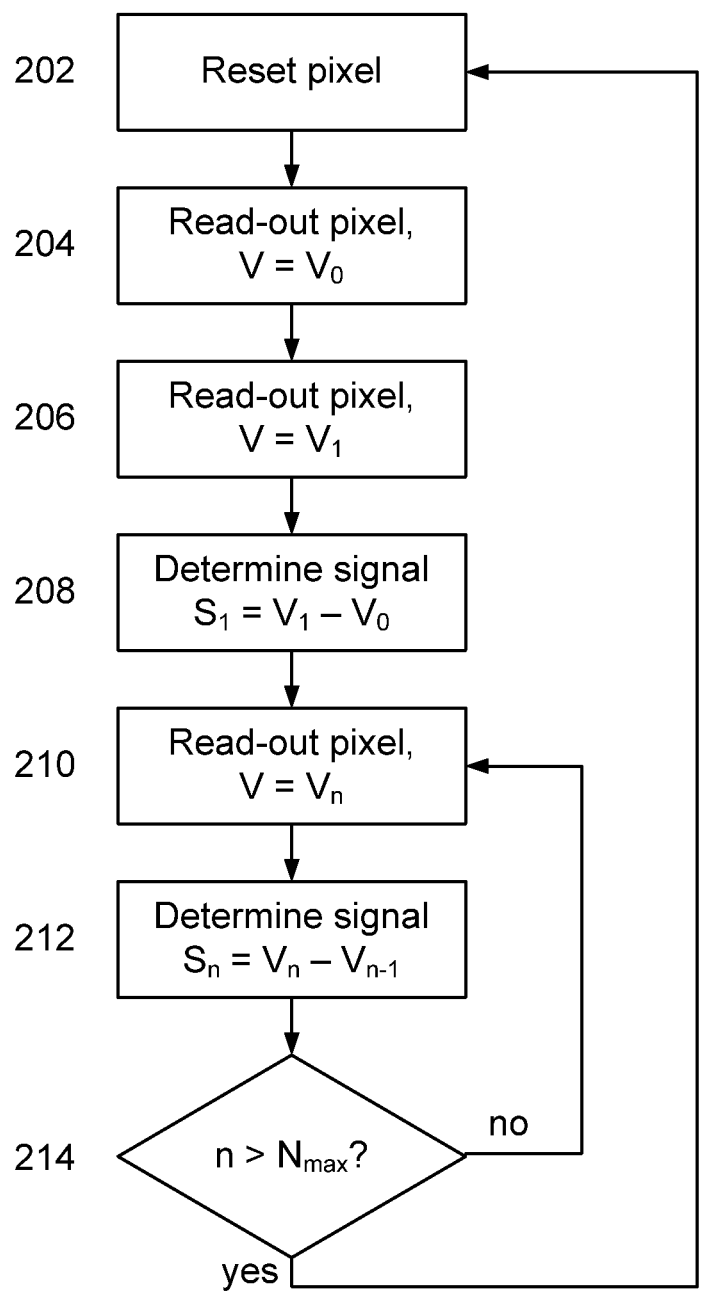

The invention is now elucidated using figures, where identical reference numerals refer to corresponding features. To that end:

FIG. 1 schematically shows the voltage on a pixel, and
FIG. 2 schematically shows a flowchart of the method
FIG. 1 schematically shows the voltage 101 on a pixel. At time $T_0$ the pixel is reset and the voltage on the pixel corresponds to voltage 102. It is noted that this need not be zero volts, but can be substantially higher, such as shown value 103. It is noted that some noise is superimposed on the signal 101, due to normal noise contributions, but this noise is less than a predetermined value 104 corresponding with one incident particle. At moment $T_1$ it is detected that two subsequent read-outs differ at least a value 104 of each other, and thus an event (an impinging particle) is detected. Likewise such events are detected at $T_2$, $T_3$ and $T_4$. At $T_5$ it is detected that the signal reaches a value at or above predetermined level 105, indicating that the pixel is close to its full-well capacity. Therefore a reset is generated, resulting in a new reset value 106. It is noted that this value need not equal the previous reset level 103, but may differ slightly.

It is noted that also other reset criteria can be used, such as the number of read-outs or frames that are read, or the recognition that one pixel of the array had a value at or above its predetermined value (close to the full-well value).

It is mentioned that in the discussed example full-well (or more accurately the predetermined level) is achieved after only 4 events, but that typically the full-well capacity is more than 10 events, and the predetermined level can be chosen to correspond with 8-10 events.

FIG. 2 schematically shows a flowchart of the method.
In step 202 the method starts with a reset of the pixel or all pixels.
In step 204 the voltage of the or each pixel is read-out, resulting in a voltage $V_0$ for the or each pixel.
In step 206 the pixel or pixels are read-out for a second time, resulting in a voltage $V_1$ for the or each pixel.
In step 208 the signal $S_1$ of the or each pixel is determined by subtracting $V_0$ from $V_1$
In step 210 the pixel or pixels are read-out again, resulting in a voltage $V_2$
In step 212 the signal $S_2$ is determined by subtracting $V_1$ from $V_2$.
In step 214 the break-off criterion is tested, for example whether the reset occurred a predetermined number of read-outs ago. Other criteria, for example whether one pixel of the array reached a value at or above its predetermined value (close to the full-well value, for example 0.8× the full-well capacity) can be used as criterion to reset the whole array of pixels, or the pixels can be reset pixel by pixel when reaching the predetermined value (only applicable if pixels can be reset independently).

It is noted that the prior art method jumps from step 208 to 202. If the frame rate of a sensor is N frames/second, then the prior art method achieves image rate of N/2 images per second, while the method according to the invention, using a reset criterion of e.g. a reset after a fixed number of 10 frames, $(1-1/10) \times N = 0.9 \times N$ images per second, almost twice as fast and almost as fast as the frame rate itself, still offering the performance of the prior art method using CDS on the sensor (chip), all this on the same chip.

The latter implies that the method may also be implemented on an existing apparatus comprising a direct electron sensor, such as a CMOS chip, to detect electrons. Such sensors are known to be used in, for example, electron microscopy, more specifically Transmission Electron Microscopy (TEM). The invention explicitly seeks protection for upgrading existing camera's/apparatuses.

We claim as follows:

1. A method for acquiring data with an image sensor, the sensor showing a multitude of pixels, the sensor using a reset to bring the pixels to a predetermined state, the method comprising:
    resetting the voltage of a pixel;
    reading the voltage of the pixel a first time, resulting in a first read-out value for the pixel;
    reading the voltage of each pixel a second time, resulting in a second read-out value for the pixel;
    determining a first signal by subtracting the first read-out value from the second read-out value of the pixel;
    reading the voltage of the pixel a third time, resulting in a third read-out value, no reset occurring between reading the voltage of the pixel a second time and reading the voltage of the pixel a third time; and
    determining a second signal by subtracting the second read-out value from the third read-out value.

2. The method of claim 1 in which reading the voltage of the pixel a third time the pixel is read-out multiple times before a reset occurs, resulting in multiple read-out values, and multiple signals are determined by pair-wise taking a read-out value and subtracting from that value the previous read-out value of a pixel.

3. The method of claim 1 in which the sensor detects particles which include electrons, neutrons, positrons, and X-rays.

4. The method of claim 3 in which the signal is expressed as the detection of a particle by comparing the signal of one or more pixels to a predetermined threshold value, the threshold value corresponding to the minimum signal that a single detected particle causes.

5. The method of claim 4 in which the signal of several adjacent pixels is used to be compared with the predetermined value.

6. The method of claim 1 in which the sensor is a CMOS sensor and each pixel is reset after a predetermined number of read-outs or images.

7. The method of claim 1 in which the sensor is a CMOS sensor and the reset is generated when, in the series of read-outs representing the last image, at least one pixel has a read-out value above a predetermined value.

8. The method of claim 1 in which the sensor is a CMOS sensor and the reset is generated for each pixel independently when said pixel has a read-out value above a predetermined value.

9. The method of claim 1 in which the sensor is a CCD sensor and the pixel that is reset is the output node of a series of pixels.

10. A camera for detecting radiation, the camera comprising an image sensor and a controller for controlling reading-out and reset of the sensor, wherein the controller is programmed for performing the method of claim 1.

11. The camera of claim 10 wherein the controller is further programmed for performing the method of claim 2.

12. The camera of claim 10 wherein the sensor detects particles from the group of electrons, neutrons, positrons, and X-rays.

13. The camera of claim 12 wherein the signal is expressed as the detection of a particle by comparing the signal of one or more pixels to a predetermined threshold value, the threshold value corresponding to the minimum signal that a single detected particle causes.

14. The camera of claim 13 wherein the signal of several adjacent pixels is used to be compared with the predetermined value.

15. The camera of claim 10, wherein the sensor comprises a CMOS sensor or a CCD sensor.

16. The camera of claim 15, wherein the sensor is a CMOS sensor and each pixel is reset after a predetermined number of read-outs or images.

17. The camera of claim 15, wherein the sensor is a CMOS sensor and the reset is generated when, in the series of read-outs representing the last image, at least one pixel has a read-out value above a predetermined value.

18. The camera of claim 15, wherein the sensor is a CMOS sensor and the reset is generated for each pixel independently when said pixel has a read-out value above a predetermined value.

19. The camera of claim 15, wherein the sensor is a CCD sensor and the pixel that is reset is the output node of a series of pixels.

20. The method of claim 1 comprising when reading-out a number of images, M, the number of read-out cycles is equal to M+1.

* * * * *